United States Patent [19]
Gillberg-LaForce et al.

[11] Patent Number: 5,128,223
[45] Date of Patent: Jul. 7, 1992

[54] POLYMERIC DIRECT IMAGING HOLOGRAPHIC COMPOSITIONS

[75] Inventors: Gunilla E. Gillberg-LaForce, Summit; Edward Yokley, Somerset; James E. Kuder, Fanwood; Elizabeth Fernekess, Basking Ridge, all of N.J.

[73] Assignee: Hoechst Celanese Corp., Somerville, N.J.

[21] Appl. No.: 538,860

[22] Filed: Jun. 15, 1990

[51] Int. Cl.$^5$ .................... G03H 1/00; G03C 9/08
[52] U.S. Cl. ...................... 430/2; 430/290; 359/3
[58] Field of Search ............ 430/2, 1; 350/3.61, 350/3.65; 359/3, 1

[56] References Cited

U.S. PATENT DOCUMENTS

4,782,008  11/1988  Babich et al. ................ 430/313
4,810,601  3/1989   Allen et al. ................. 430/313 X

OTHER PUBLICATIONS

Herwig Kogelnik, "Hologram Efficiency and Response", *Laser Technology*, Nov. 1967, pp. 68-73.

*Primary Examiner*—Cynthia Hamilton
*Attorney, Agent, or Firm*—P. S. Kalyanaraman

[57] ABSTRACT

In one embodiment this invention provides a process for preparing a holographic composition which is a thin film of polyphenyl acylate polymer which has a photo-Fries molecular rearrangement corresponding to a recorded refractive index pattern induced by exposure to a coherent light interference pattern.

19 Claims, No Drawings

POLYMERIC DIRECT IMAGING HOLOGRAPHIC COMPOSITIONS

BACKGROUND OF THE INVENTION

Holography is a form of optical information storage. The general principles are described in references such as "Photography by Laser" in SCIENTIFIC AMERICAN, 212 (No. 6), 24–35 (1965). In a holographic process, the object to be photographed or imaged is illuminated with coherent light (e.g., from a laser), and a light sensitive recording medium (e.g., a photographic plate) is positioned to receive light reflected from the object. Each point on the object reflects light to the entire recording medium, and each point on the medium receives light from the entire object. The reflected light beam is known as the object beam. Simultaneously a portion of the coherent light is beamed by a mirror directly to the medium, bypassing the object. The light is known as the reference beam. What is recorded on the recording medium is the interference pattern that results from the interaction of the reference beam and the object beam impinging on the medium. When the processed recording medium is subsequently illuminated and observed, the light from the illuminating source is diffracted by the hologram to reproduce the wave-front that originally reached the medium from the object. The hologram resembles a window through which the virtual image of the object is observed in full three-dimensional form, complete with parallax.

Holograms that are formed by allowing the reference and object beams to enter the recording medium from the same side are known as transmission holograms. Interaction of the object and reference beams in the recording medium forms fringe areas with varying refractive indices which are normal or near normal to the plane of the recording medium. When the hologram is played back by viewing with transmitted light, these fringes refract the light to produce the viewed virtual image. Such transmission holograms may be produced by well-known methods such as those described in U.S. Pat. Nos. 3,506,327; 3,694,218; 3,838,903; 3,894,787; 3,951,663; 4,055,423; 4,139,388; 4,258,111; and 4,374,189.

A diffraction grating is the simplest form of transmission hologram. It is the hologram of two coherent plane waves. It can be created by splitting a single laser beam and recombining the beams at the recording medium.

A diffraction grating can be characterized by its Diffraction Efficiency, i.e., the percent of the incident radiation which is diffracted into forming the image. The greater the Diffraction Efficiency, the brighter the image in viewing light.

Refractive index modulation is a quantitative measure of the change in refractive index image. For the diffraction grating, refractive index modulation is the measure of the amplitude of the sinusoidal modulation of the refractive index within the recording medium produced when the holographic image is recorded. The refractive index modulation, or index modulation, for a volume recording medium is best determined by holographically forming a grating in the medium and calculating the index modulation using Kogelnik's coupled wave theory and the measured parameters of the grating formed, i.e, the Diffraction Efficiency, medium thickness, and the like.

A variety of materials have been used to record volume holograms, such as silver halide emulsions, hardened dichromated gelatin, ferroelectric crystals, photopolymers, photochromics and photodichroics. Characteristics of these materials are given in *Volume Holography and Volume Gratings*. Academic Press, New York, 1981, chapter 10, pp 254–304 by L. Solymar and D. J. Cook.

Dichromated gelatin is the material most widely used for recording volume holograms. This material has become the popular choice because of its high Diffraction Efficiency and low noise characteristics. However, the material has poor shelf life and requires wet processing to develop the hologram. Wet processing involves an additional step in hologram preparation, and also can cause the hologram image to distort due to volume changes in the gelatin medium during processing. Reproducibility is difficult to achieve with dichromated gelatin.

U.S. Pat. No. 3,658,526 describes solid photopolymerizable materials that require only a single process step to prepare stable high-resolution holograms with a refractive index image. The refractive index modulation is in the range of 0.001–0.003, and reconstructed holographic images are reported to have limited brightness because of low Diffraction Efficiency.

There is continuing interest in the development of new and improved holographic media, and methods for single step holographic recording of optical information.

Accordingly, it is an object of this invention to provide polymeric film media which can record a refractive index modulation pattern induced by a laser interference light pattern.

It is a further object of this invention to provide a single step process for recording a phase holographic image in a polymeric thin film by means of a laser interference pattern induced molecular rearrangement.

Other objects and advantages of the present invention will become apparent from the accompanying description and examples.

DESCRIPTION OF THE INVENTION

One or more objects of the present invention are accomplished by the provision of a holographic composition comprising a thin film of polyphenyl acylate polymer which has a photo-Fries molecular rearrangement corresponding to a recorded refractive index pattern induced by an interference light pattern.

In another embodiment this invention provides a process for recording a phase holographic image which comprises exposing a polymeric thin film medium to a laser interference pattern, wherein the polymeric medium comprises a polyphenyl acylate polymer which undergoes a photo-Fries molecular rearrangement corresponding to a refractive index modulation pattern induced by the interference pattern.

In a further embodiment this invention provides a holographic composition comprising a thin film of a polyphenyl acylate polymer which has (1) a photo-Fries molecular rearrangement corresponding to a recorded refractive index phase shift pattern, and (2) a surface relief pattern; wherein the refractive index pattern and the relief pattern are coincidental images induced by a laser interference pattern.

A polymeric thin film suitable for the production of a present invention hologram composition can consist of a polymer which is characterized by recurring phenyl acylate structures corresponding to the formula:

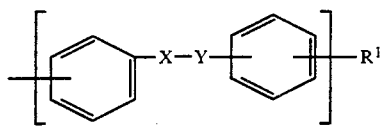

where X is —O—, —NR— or —S—, and R is hydrogen or a $C_1$-$C_4$ alkyl group; Y is —CO— or —$SO_2$; and $R_1$ is hydrogen or a recurring divalent organic radical in a polymeric main chain.

One type of phenyl acylate polymer is illustrated by polyarylates such as a condensation polymer of a bisphenol and a phthalic acid. An example of a specific polyarylate structure is a condensation product of 4,4'-isopropylidenediphenol and isophthalate:

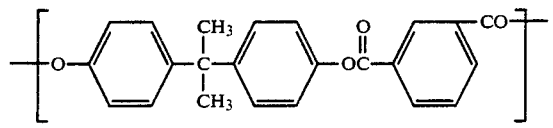

This type of condensation polymer structure is described in J. Polym. Sci., 9, 3263 (1971).

Another type of phenyl acylate polymer is illustrated by a poly(alkanoylstyrene) such as poly(acetoxystyrene):

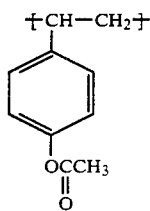

Another type of phenyl acylate polymer is illustrated by polyphenyl acrylate or methacrylate:

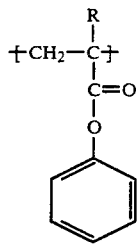

Polyphenyl acrylate type polymers are described in Chapter 3 of Materials For Microlithography, ACS (0097-6156/94/0266-0269).

A typical holographic composition in accordance with the present invention has a bandwidth sensitivity between about 250–500 nm, a spatial resolution between about 100–6000 lines per millimeter, and a refractive index pattern modulation range between about 0.00–0.05.

Thin films of the invention photo-Fries susceptible polymers can be prepared by spin-coating an organic solution of the polymer onto a suitable substrate such as quartz, then drying the coating to remove the solvent and form a homogeneous optical thin film medium. The thickness of the thin film will vary in the range between about 0.5–20 microns. Thick films can be prepared by draw-coating with a blade applicator.

Suitable solvents for preparing the coating solutions include methylene chloride; 1,1,2-trichloroethane; 1,2,3-trichloropropane; dimethylformamide; diglyme; and the like.

A coherent light source such as a laser beam is utilized to deliver at least about 1000 mJ/$cm^2$ to the polymeric thin film to induce the photo-Fries molecular rearrangement. The photo-Fries reaction is susceptible to ultraviolet irradiation, but for purposes of forming a hologram it is necessary to utilize a coherent light beam of the type provided by rare gas-halide lasers such as ArF, KrF, XeCl and XeF, and other coherent light sources such as argon, helium-neon or krypton laser beams.

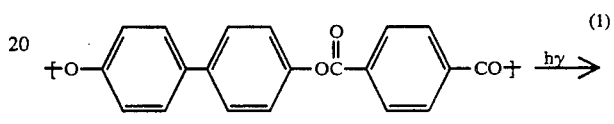

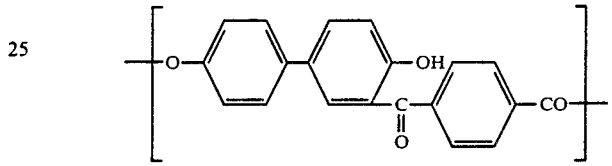

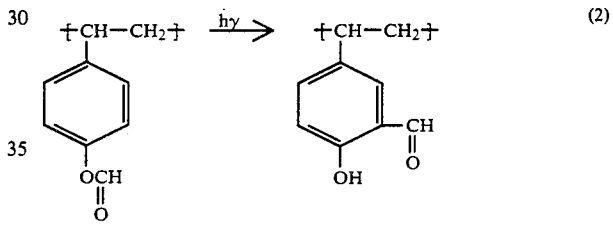

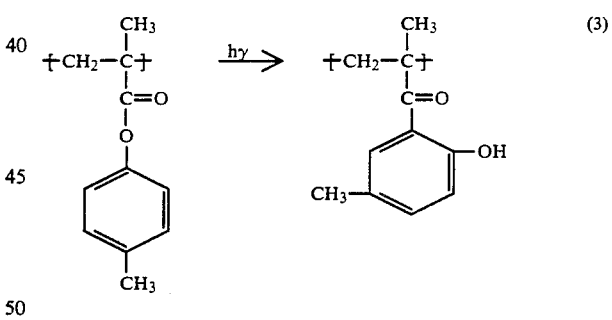

The result of the laser exposed thin film is a molecular rearrangement as illustrated above, and the formation of a refractive index modulation pattern induced by the impinging laser interference pattern. In a viewing light beam, the refractive index pattern is reproduced as a virtual image of the original object beam and reference beam interaction.

A unique feature of a present invention hologram is the formation of a relief pattern on the thin film surface. The surface relief pattern and the refractive index pattern are formed simultaneously, and are coincidental images of the laser interference pattern impinged on the thin film. The relief pattern and refractive index pattern are directly coincidental because the photo-Fries molecular rearrangement is characterized by a refractive index change and a concomitant volume reduction in the thin film, both of which effects are proportional to the energy input intensity of the laser interference pattern fringes.

The following examples are further illustrative of the present invention. The components and specific ingredients are presented as being typical, and various modifications can be derived in view of the foregoing disclosure with in the scope of the invention.

EXAMPLE I

This Example illustrates refractive index modulation in thin films by photo-Fries molecular rearrangement in polyphenyl acylate polymers.

Thin films are spin-coated onto quartz glass. The films are analyzed before and after UV irradiation by UV/VIS/NIR transmission spectroscopy using a thin film interference model to calculate changes in refractive index. A Perkin-Elmer Lambda-9 UV/VIS/NIR spectrometer is employed with a precision machined holder which permits the same spot on the film to be analyzed before and after irradiation. The digital spectra are transferred from the spectrometer computer to a thin film analysis software program which uses a thin film interference model to calculate the refractive index as a function of wavelength.

A RPC Industries processer which allows a sample on a moving belt to be irradiated by a mercury-xenon source with a lamp setting of 400W/inch and a belt speed of 10 ft/min is used to deliver broad band UV irradiation with an energy of approximately 1000 mJ/cm$^2$ in the region 254-312 nm.

The polymers used are Durel 400 (75:25 isophthalic to terephthalic acid) from Hoechst Celanese Engineering Plastic Division with an IV of 0.60 and Mn of 14,800; Ardel D-100 (50:50 isophthalic to terephthalic acid) from Amoco, with an IV of 0.61; poly(acetoxystyrene) from Hoechst Celanese Research Division, with a .Mw of 327,000; and a homogeneous 50/50 blend of an aliphatic polyester as described in U.S. Pat. No. 4,246,381 and Durel.

The polymers are dissolved 10% by weight in trichloropropane (the blend is dissolved in trichloroethane) and filtered through a 0.2 μm filter. A Model 5100 Manual Photoresist Spinner (Solitec, Inc.) is used for film coating. After the filtration, the solutions are dispensed onto the cleaned quartz substrate, then spread for 3 seconds at 500 rpm, and spun at 1000-3000 rpm for 40 seconds. The film samples are dried for one hour at 90° C., and then dried in a vacuum oven under nitrogen. The film thickness is determined by using a Dektak IIA surface profilometer (Sloane Instruments). The following changes in refractive index are observed.

| Polymer | Film Thickness, μm | Irrad. Time, sec. | Refractive Change. Δn |
|---|---|---|---|
| Durel | 3.9 | 18 | 0.006 |
|  | 1.9 | 18 | 0.005 |
|  | 1.9 | 36 | 0.020 |
|  | 1.9 | 75 | 0.055 |
| Ardel | 2.0 | 24 | 0.008 |
| Poly(acetoxystyrene) | 1.7 | 36 | 0.011 |
|  | 1.7 | 75 | 0.047 |
| Blend | 1.5 | 36 | 0.013 |

EXAMPLE II

This Example illustrates the production of high contrast diffraction gratings in thin films by photo-Fries rearrangement in polyphenyl acylate polymers.

A Suss MJB 3 mask aligner equipped with a mercury-xenon source and optics to provide collimated radiation at mW/Cm$^2$ irradiation at 254-315 nm. Masks with grating periods of 14, 16, 18 and 20 μm periodicity are clamped onto 1.92 μm thick films of Durel and 2.48 μm thick films of poly(acetoxystyrene) respectively, and an irradiation period of 4 hours is used.

The Diffraction Efficiency of the thin films is determined by placing the samples in a beam from a HeNe laser (633 nm) and measuring the intensity for the first order diffracted beam and the total transmitted intensity from a nondiffracted beam. Up to 25 diffraction orders are observed from the thin film gratings. The Durel samples exhibits a Diffraction Efficiency of 4.5% for the 18 μm grating, and 6.9% for the 14 μm grating. The Diffractive Efficiencies of the poly(acetoxystyrene) samples are 8.2 and 9.6% for the 20 and 16 μm gratings, respectively.

All samples show a surface grating with the same periodicity as the masks of depth from 0.14 to 0.22 μm. The change in refractive index is of the order of 0.01 by Mach-Zehnder interferometric measurements employing index matching liquids.

EXAMPLE III

This Example illustrates the production of holographic gratings in accordance with the present invention.

Holographic gratings are produced utilizing an Innova 200-25 argon ion laser (Coherent Corp.). The laser beam is directed by UV enhanced aluminum mirrors through enlarging lenses and a collimator into a beam splitter wherein the beam is divided into two approximately equal beam segments (less than 10% difference in intensity). Each beam is reflected by a mirror to converge in the plane of the sample. The bisector of the angle between the beams is approximately normal to the sample plane. Variations in the distance between the mirrors and the sample allows changes in the angle between the converging beams, and thereby the grating period. The vertical polarization of the laser light is maintained along the optical train. The grating period Λ is calculated from the angle between the beams ($\theta$) and the wavelength ($\lambda$) according to $\Lambda = \lambda/2 \sin \theta/2$.

Thin film holographic gratings are written in 1.9 μm Durel film by means of a 300 nm Argon line with a combined power input of 125 mW. The beam geometry employed provides a $\theta$ of 9.5°, and a calculated grating period of 1.9 μm. A maximum in Diffraction Efficiency is observed after 10 seconds and corresponds to a refractive index modulation of 0.003. The distance between beam mirrors and sample is adjusted to provide an angle $\theta$ of 25° and a calculated grating period of 0.7 μm. After 10 seconds irradiation a well defined diffraction grating is obtained with a refractive index modulation of 0.005. Reflected differential interference contrast microscopy confirms that the medium can image a refractive index modulated grating with a high periodicity.

Gratings with comparatively low frequency are obtained by using a long distance between sample and mirrors which provides an angle $\theta$ of approximately 2° and a grating period of 9-10 μm. In this case the beam intensity is reduced to 20 mW. The grating formation is followed in real time by passing a 633 nm HeNe beam through the center of the exposed area. A continuous increase in Diffraction Efficiency is observed for up to 2 minutes exposure. The calculated refractive index modulation using the first order Bessel function approximation is 0.01.

EXAMPLE IV

This Example illustrates the production of holographic gratings in accordance with the present invention.

Durel is knife-coated onto quartz glass to form a 10 μm thick film. The 300 nm line of an Argon laser is used with a power input of 25 mW, and a beam geometry yielding a 1 μm grating is used. A grating with a diffraction efficiency of 12.5% (measured at the Bragg angle) is obtained after 2 minutes exposure. In a second exposure the 305 nm line is selected, and a Diffraction Efficiency of 25.8% is observed. In a third exposure the 335 nm line is selected, and no diffraction grating is observed after 5 minutes irradiation.

A 9 μm thick film of poly(acetoxystyrene) is irradiated with the 275 nm line at a power input of 20 mW for 60 seconds. A grating with a period of 2 μm and a Diffraction Efficiency of 11.7% is obtained.

A 14 μm thick film of a homogeneous 50/50 blend of Durel and an aliphatic polyester[1] is irradiated with a 305 nm line and 20 mW power input for 1 second. A grating with a period of 2 μm and 10.7% Diffraction Efficiency results. When the irradiation is performed at 14 mW for 2 minutes a grating with a Diffraction Efficiency of 25% results.

(1) Copolyester derived from cyclohexanedimethanol, an alkyleneglycol and an aromatic dicarboxylic acid (U.S. Pat. No. 4,246,381).

What is claimed is:

1. A holographic medium comprising a thin film of polyphenyl acylate polymer which has a photo-Fries molecular rearrangement corresponding to a recorded refractive index pattern induced by an interference light pattern.

2. A holographic medium in accordance with claim 1 wherein the polymer is characterized by recurring phenyl acylate structures corresponding to the formula:

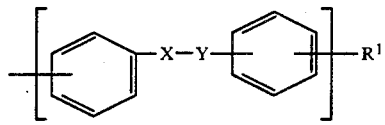

where X is —O—, —NR— or —S—, and R is hydrogen or a $C_1$-$C_4$ alkyl group; Y is —CO— or —SO$_2$—; and $R^1$ is hydrogen or a recurring divalent organic radical in a polymeric main chain.

3. A holographic medium in accordance with claim 1 wherein the polymer is a polyarylate.

4. A holographic medium in accordance with claim 1 wherein the polymer is a condensation polymer of a bisphenol and a phthalic acid.

5. A holographic medium in accordance with claim 1 wherein the polymer is a condensation product of 4,4'-isopropylidenediphenol and an isophthalate/terephthalate mixture.

6. A holographic medium in accordance with claim 1 wherein the polymer is poly(acetoxystyrene).

7. A holographic medium in accordance with claim 1 wherein the polymer is polyphenyl acrylate or methacrylate.

8. A holographic medium in accordance with claim 1 which has a bandwidth sensitivity between about 250-500 nm.

9. A halographic medium in accordance with claim 1 which has a spatial resolution between about 100-6000 lines per millimeter.

10. A halographic medium in accordance with claim 1 wherein the refractive index pattern modulation range is between about 0.001-0.05.

11. A process for recording a phase holographic image which comprises exposing a polymeric thin film medium to a laser interference pattern, wherein the polymeric medium comprises a polyphenyl acylate polymer which undergoes a photo-Fries molecular rearrangement corresponding to a refractive index modulation pattern induced by the interference pattern.

12. A process in accordance with claim 11 wherein the polymer is characterized by recurring phenyl acylate structures corresponding to the formula:

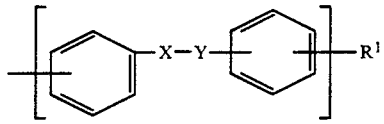

where X is —O—, —NR— or —S—, and R is hydrogen or a $C_1$-$C_4$ alkyl group; Y is —CO— or —SO$_2$—; and $R_1$ is hydrogen or a recurring divalent organic radical in a polymeric main chain.

13. A process in accordance with claim 11 wherein the polymer is a polyarylate.

14. A process in accordance with claim 11 wherein the polymer is a condensation polymer of a bisphenol and a phthalic acid.

15. A process in accordance with claim 11 wherein the polymer is a condensation product of 4,4'-isopropylidenediphenol and an isophthalate/terephthalate mixture.

16. A process in accordance with claim 11 wherein the polymer is poly(acetoxystyrene).

17. A process in accordance with claim 11 wherein the polymer is polyphenyl acrylate or methacrylate.

18. A holographic medium comprising a thin film of a polyphenyl acylate polymer which has (1) a photo-Fries molecular rearrangement corresponding to a recorded refractive index phase shift pattern, and (2) a surface relief pattern; wherein the refractive index pattern and the relief pattern are coincidental images induced by a laser interference pattern.

19. A holographic medium in accordance with claim 18 wherein the thin film comprises a blend of two or more polymers, at least one of which is a polyphenyl acylate polymer.

* * * * *